United States Patent [19]

Matsuda et al.

[11] Patent Number: 5,379,228
[45] Date of Patent: Jan. 3, 1995

[54] HEAT TREATMENT METHOD

[75] Inventors: Naoko Matsuda; Hiroyuki Naka, both of Osaka, Japan

[73] Assignee: Matsushita Electric Industrial Co., Ltd., Osaka, Japan

[21] Appl. No.: 957,790

[22] Filed: Oct. 8, 1992

[30] Foreign Application Priority Data

Oct. 8, 1991 [JP] Japan .................................. 3-260003

[51] Int. Cl.⁶ .............................................. G06F 15/46
[52] U.S. Cl. ........................................ 364/477; 432/11
[58] Field of Search ................ 364/477, 557; 266/171, 266/176, 178, 185, 78, 80, 96, 99; 432/9–13, 36–49, 51–53; 118/696, 697, 708, 712; 427/10

[56] References Cited

U.S. PATENT DOCUMENTS

| 4,338,078 | 7/1982 | Lampkin | 432/11 |
| 4,736,304 | 4/1988 | Doehler | 364/496 X |
| 5,136,972 | 8/1992 | Naka et al. | 118/411 X |
| 5,154,810 | 10/1992 | Kamerling et al. | 118/712 X |

FOREIGN PATENT DOCUMENTS 1-170577  7/1989  Japan .

OTHER PUBLICATIONS

"Heat Transfer"; Holman, Jack Philip; Fifth Edition; 1976; McGraw Hill, pp. 135–139.

Primary Examiner—Joseph Ruggiero
Attorney, Agent, or Firm—Wenderoth, Lind & Ponack

[57] ABSTRACT

In a method of minimizing the temperature difference on a large area plate in a sintering step of manufacturing a solar cell and using a cover for making the heat equal, a cover with the hole pitch and the hole location being set in it is used in an analysis to quantitatively determine the cover shape for realizing the equal-heat heating, whereby the heat equalizing operation of the plate can be realized.

1 Claim, 4 Drawing Sheets

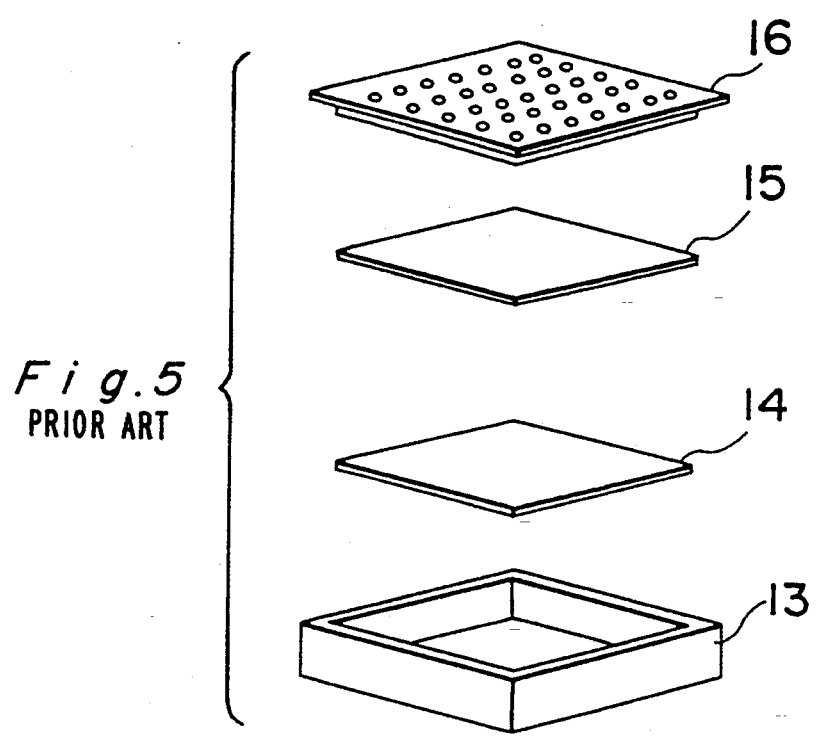

HEAT TREATMENT METHOD

BACKGROUND OF THE INVENTION

The present invention generally relates to a plate sintering method to be used in a sintering process and so on of a screen-printing and sintering type solar cell plate.

A manufacturing process of a screen-printing and sintering type solar cell will be described as a representative example. FIG. 3(a) shows a screen printing step of extending the paste 1 of a film component of a solar cell through a screen 2 so as to make a printing film 4 on a plate 3 using a screen printing machine. FIG. 3(b) shows a drying step of effecting a low temperature drying operation, by a heater 6, of above described plate on a conveyer belt. FIG. 3(c) shows a sintering process of sintering the printing film 4 with a belt type electric furnace 7. A CdS film, a CdTe film, a C film, and an Ag+In film are sequentially combined by the repetition of the respective printing, drying, and sintering operations. A general belt type electric furnace used in the sintering step is shown in FIG. 4.

A heat treatment container with a plate 10 being accommodated in it is heated, on a conveyor belt 8 moving at a constant velocity v, within an inert gas atmosphere 12 by a muffler 11 having a heat source for continuously causing a given heat gain amount quantity of heat. The heat treatment container 9 is moved into the electric furnace. It is normally heated gradually to approximately 700° C. and is retained within the muffler 11 for approximately one hour. Thereafter, it is gradually cooled near the exit to a normal temperature and is then taken out. The construction of the heat treatment container 9 is shown in FIG. 5. A plate 15, and an intermediate plate 14 for preventing the thermal deformation of the plate 15 are accommodated in a boat 13 made chiefly of a heat-proof ceramic. A cover 16 is provided with aperture portions for controlling the heat radiation coming from the heater of the electric furnace and the evaporation of the film components.

A sintering method of using such a heat treatment container as in FIGS. 3(a)–3(c) that is the conventional solar cell sintering method is not necessarily good in terms of the thermal efficiency of the plate, especially in a large area plate of approximately 1200 cm². Large temperature differences are caused forward and rearward in the advancing direction of the heat treatment container and the plate, and the fusing reaction of the CdS film and the CdTe film become unequal, thus causing dispersion in the light/voltage conversion efficiency and so on of the solar cells.

Masking to realize a heat equalization with an object of controlling the heat radiation on the plate with respect to the above described basic problem has already been proposed is Japanese Laid-Open Patent Publication No. 1-105777). Such masking is considered to be applicable to the cover of the heat treatment container 9.

When the cover of the heat treatment container 9 has been designed using of the aforementioned masking method, drilling and so on have to be frequently changed in accordance with the hole diameter or the area aperture portions in the processing. When the productivity is considered, the efficiency is inferior.

SUMMARY OF THE INVENTION

Accordingly, the present invention has been developed with a view to substantially eliminating the above discussed drawbacks inherent in the prior art and has for its essential object to provide an improved basic sintering method.

Another important object of the present invention is a method of controlling the heat radiation with the density of the pitch width and the hole or the area aperture portion location to make them optimum, and to provide a plate sintering method of a heat equalization similar to or higher than the heat equalizing by the above described prior art method.

In accomplishing these and other objects, according to one preferred embodiment of the present invention, there a plate sintering method is provided which includes the steps of using a thermal analysis method based on the laws of thermodynamics, and a method of quantitatively determining a cover shape or a boat shape for realizing heat equalization, in a sintering method of effecting a heating operation through the above described cover having one hole or a plurality of hole each hole of the plurality of holes being uniform in diameter, the cover of the heat treatment container of a plate shape is positioned in a normal direction of the above described plate, and is parallel to the heat source for generating heat radiation with respect to the heat treatment container with a thin plate shaped plate being accommodated in it.

BRIEF DESCRIPTION OF THE DRAWINGS

These and other objects and features of the present invention will become apparent from the following description taken in conjunction with the preferred embodiment thereof with reference to the accompanying drawings, in which:

FIGS. 3(a)–3(c) show views of a manufacturing process of a solar cell of the conventional screen-printing and sintering type in which FIG. 3(a) shows a screen printing step and FIG. 3(b) shows a; drying step and FIG. 3(c) shows a sintering step;

FIG. 5 is a construction view of the conventional heat treatment container.

DETAILED DESCRIPTION OF THE INVENTION

One embodiment of the present invention is described hereinafter with reference to the drawings.

Figure 1:
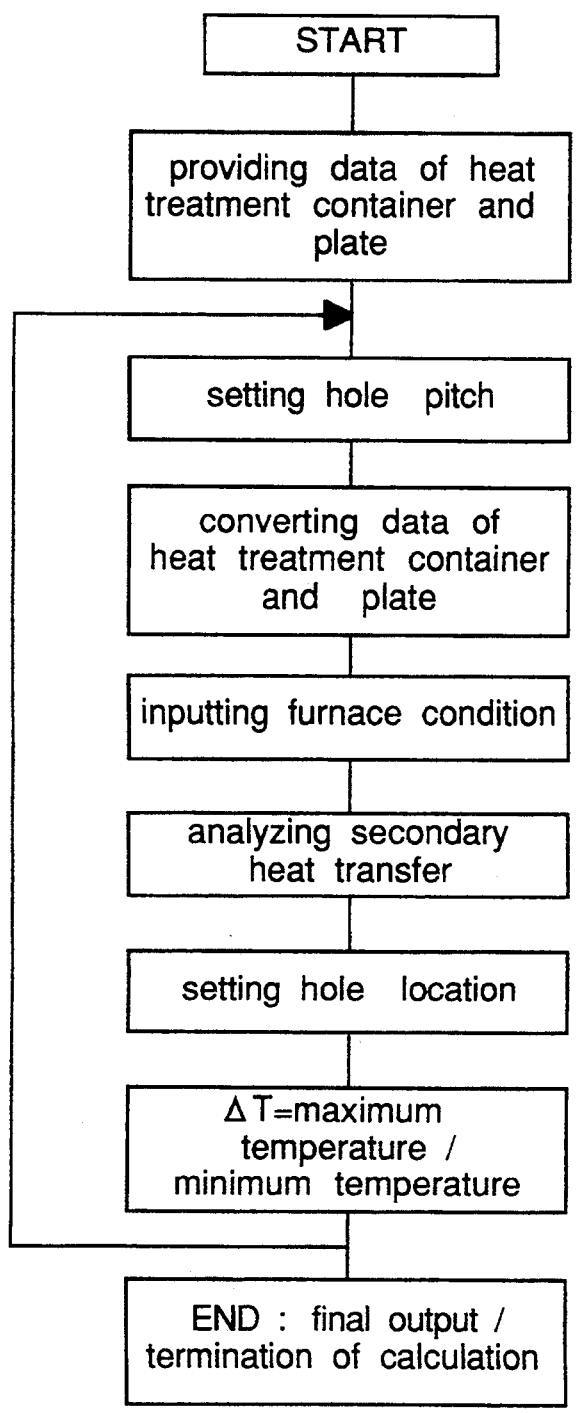
FIG. 1 is a flowchart of a heat treatment container cover shaped designing operation of a plate heating method in accordance with one embodiment of the present invention.

FIG. 1 is a flowchart on a heat treatment container cover designing method of a plate in accordance with an embodiment of the present invention. The sintering cell and basic shape data to be contained in the CAD data are loaded so as to convert them into a calculating grid for analysis. The analysis grid is equivalent to the hole pitch of the heat treatment container cover. At this time, an thermal constant of each of the parts for constituting the heat treatment container is determined by a method to be described later. The grid composition of the analysis, plays a role of newly assigning a thermal constant with respect to the representative point of the grid provided for the calculation. The temperature distribution of the heat treatment container is calculated by the established formula method to be described later when the sinkring conditions (for example, radiant heat source temperature, atmospheric temperature, velocity, plate carrying temperature and so on for each zone) of the proper furnace are given. The location of a hole of the constant diameter for controlling the heat radiation is temporarily set at the next step. When the distance between a radiant heat source, the heat treatment container and the plate is comparatively close, the thermal rays can be regarded as parallel light beams. Accordingly, the heat radiation is proportional to the distribution density of the holes provided on the analysis grid. The amount of heat radiation is varied in the location of the holes of the heat treatment container cover. The location of the holes is corrected to repeat the thermal analysis until the difference between the maximum temperature and the minimum temperature of the heat treatment container at this time becomes minimum in the heat equalizing operation. The calculation grid (hole pitch) for analysis is gradually changed by stages and the thermal analysis is repeated. The above described operation may be effected in program. The most equally heated case is determined when all the calculations have been completed so as to make the cover shape from the hole pitch and the hole position at this time.

The thermal analysis method, the thermal constant of the heat treatment container as described in constant further detail as follows.

Although the thermal analysis method to be used in the present invention is basically similar to that used in Japanese Laid/Open Patent Publication No. 62-330721, (1) the temperature distribution in the thickness z direction within the heat treatment container does not vary much as compared with the temperature distribution within the x-y surface orthogonal to the z direction and the variations, model to be handled this time, it can be neglected and the temperature distribution in the z direction can be considered to be a constant value. (2) the thermal conduction of the heat treatment container, and the plate is caused only within the x-y surface. An averaged value is used in the thickness direction z. (3) the averaged value is used in the thickness direction Z even with respect to the thermal capacity of the heat treatment container and the plate.

The above described assumption makes it possible to perform a two-dimensional calculation instead of three-dimensional calculations.

When the finite difference expansion has been effected in the generally known two-dimensional thermal analysis, the temperature of x-y surface inner grid points (i, j) at a time advanced by the incremental time interval $\Delta \tau$ with respect to the time $\tau$ is presented as an equation (1) using of the temperature $$T^{96}$$

in the adjacent grid points of the (i, j) points.

$$T_{i,j}^{\tau+\Delta\tau} = \frac{\lambda \Delta t}{C\gamma\delta_1\delta_2} \left\{ \frac{\delta_2}{\delta_1} (T_{i+1,j}^{\tau} + T_{i+1,j}^{\tau} - 2T_{i,j}^{\tau}) + \right.$$ (1)

-continued $$\left. \frac{\delta_2}{\delta_1} (T_{i,j+1}^{\tau} + T_{i,j-1}^{\tau} - 2T_{i,j}^{\tau}) \right\} + T_{i,j}^{\tau}$$

where C is the specific heat, $\lambda$ is the heat conduction, and 4 is the density of a medium and $\delta_1, \delta_2$ are respectively difference grid internals in the x, and y directions.

Assume that the above described assumption 1 is introduced in the thermal analysis equation of the present invention, further the thermal amount to be inputted, outputted in the z direction by the thermal movement, namely, thermal radiation, heat transfer from the z axis direction orthogonal to the x-y face is regarded as a concept of a transposition term so that the three-dimensional phenomenon is handled as a secondary problem by the neglect of the directional property, and the numerical equation (2) is obtained.

$$T_{i,j}^{\tau+\Delta\tau} = \frac{\lambda h \Delta t}{C\gamma\delta_1\delta_2} \left\{ \frac{\delta_2}{\delta_1} (T_{1+i,j}^{\tau} + T_{i-1,j}^{\tau} - 2T_{i,j}^{\tau}) + \right.$$ (2)

$$\left. \frac{\delta_2}{\delta_1} (T_{i,1+j}^{\tau} + T_{i,1-j}^{\tau} - 2T_{i,j}^{\tau}) + \frac{q}{\lambda h} \right\} T_{i,j}^{\tau}$$

$$\lambda = \lambda_a + \lambda_b \frac{h_b}{h_a} + \lambda_c \frac{h_c}{h_a} + \lambda_d \frac{h_d}{h_a}$$

$$C\gamma = C_a\gamma_a + \frac{C_b\gamma_b}{C_a\gamma_a} h_b + \frac{C_c\gamma_c}{c_q\gamma_q} h_c + \frac{C_d\gamma_d}{C_q\gamma_d} h_d$$

wherein h is the heat treatment container thickness, and suffixes a through d respectively refer to the boat, an intermediate plate, a glass plate, and the cover. q generally changes as a function of time $\tau$ and is easily obtained in accordance with the conditional setting of the furnace. Namely, the atmospheric temperature of the furnace at $\tau T_{air}$ at a time $\tau$ is obtained as a calculation example of the thermal amount flowing into in an z direction onto area of the $\delta_1 \times \delta_2$.

The thermal amount q of flow in the z direction per unit time is obtained by $$q(\tau) = \alpha\delta_1\delta_2(T_{air} - T_{i,j}) -$$ (3)

$$C\sigma \frac{\delta_1\delta_2\left\{\left(\frac{T_{i,j}^{\tau} + 273}{100}\right) - \left(\frac{Tw + 273}{100}\right)\right\}}{\frac{1}{\epsilon_1} + \frac{1}{\epsilon_2} - 1}$$

wherein $\alpha$ is a heat transfer ratio, Tw is a radiant light source temperature, $\sigma$ is the Stefan-Boltzmann's constant and $\epsilon_1, \epsilon_2$ are radiant ratios of the heat treatment container and the light source. An equation can be established even with respect to the difference element of the container end face in the same thinking way as described hereinabove.

Assume that the hole shape of the heat treatment container cover is superposed on the difference grid disposed between the radiant light source and the heat treatment container and an open area ratio R (i, j) is defined by a ratio of the hole diameter area So (i, j) compared to the region areas $\delta_1$ and $\delta_2$ represented by the difference grid. Namely, $$R(i,j) = S_0(i,j)/\delta_1\delta_2 \quad (4)$$

Therefore, when the thermal controlling operation using the cover is effected, a term of radiation, namely, the right side second term from the thermal flow amount in the z direction shown by the equation (3) must be multiplied by the R (i, j). Therefore, at this time, $$q(\tau) = \alpha\delta_1\delta_2(T_{air} - T_{i,j}) - $$

$$R(i,j)C\sigma \frac{\delta_1\delta_2\left\{\left(\frac{T_{i,j}^\tau + 273}{100}\right) - \left(\frac{Tw + 273}{100}\right)\right\}}{\frac{1}{\epsilon_1} + \frac{1}{\epsilon_2} - 1} \quad (5)$$

Figure 2:
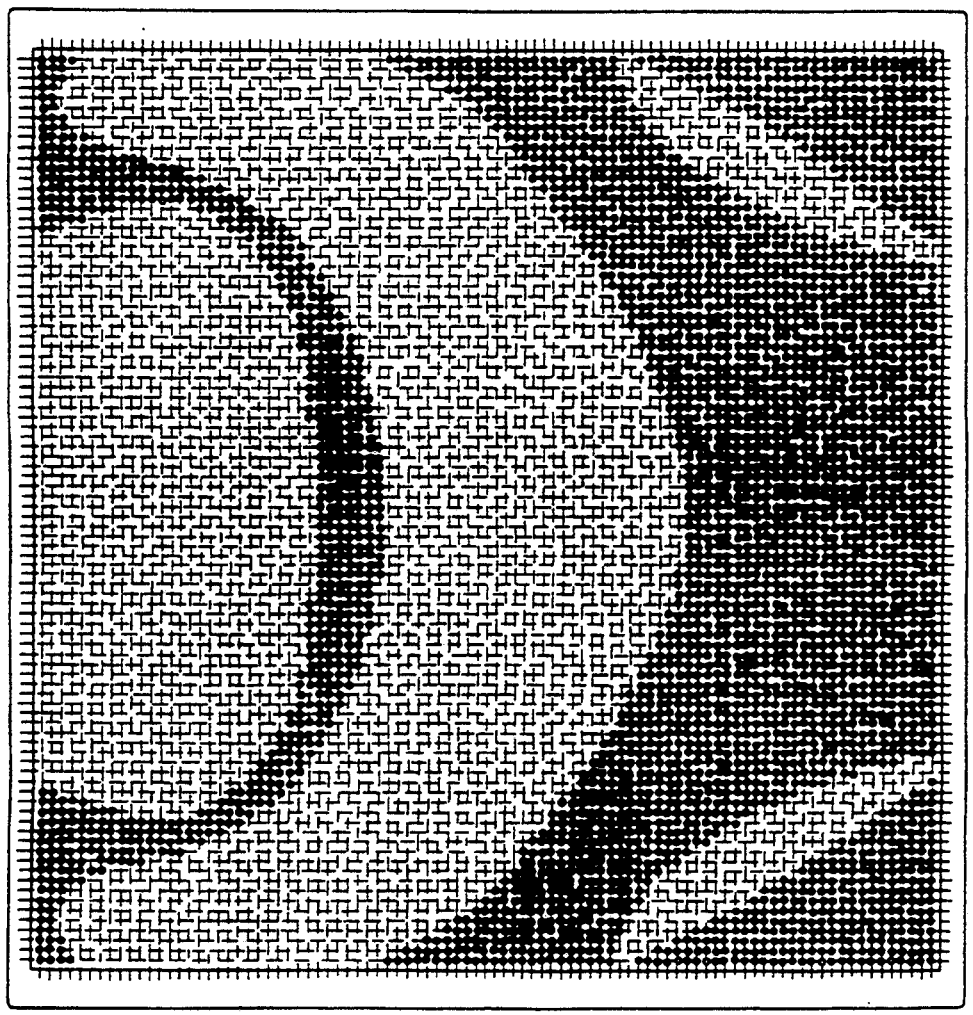
FIG. 2 is an optimum cover hole distribution view obtained by the method of the present invention.
Figure 3A:
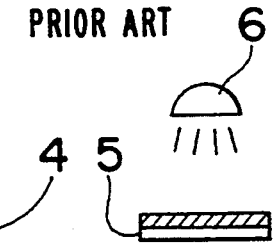
Figure 3B:
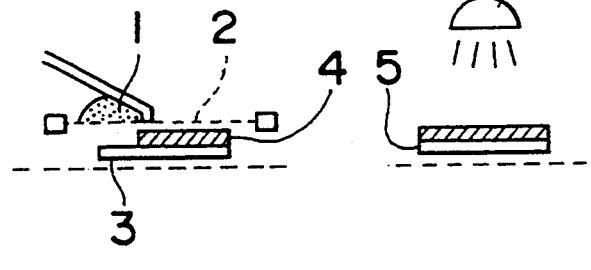
Figure 3C:
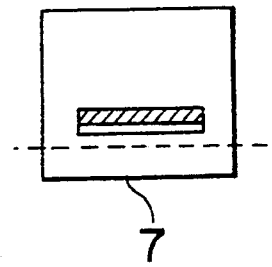
Figure 4:
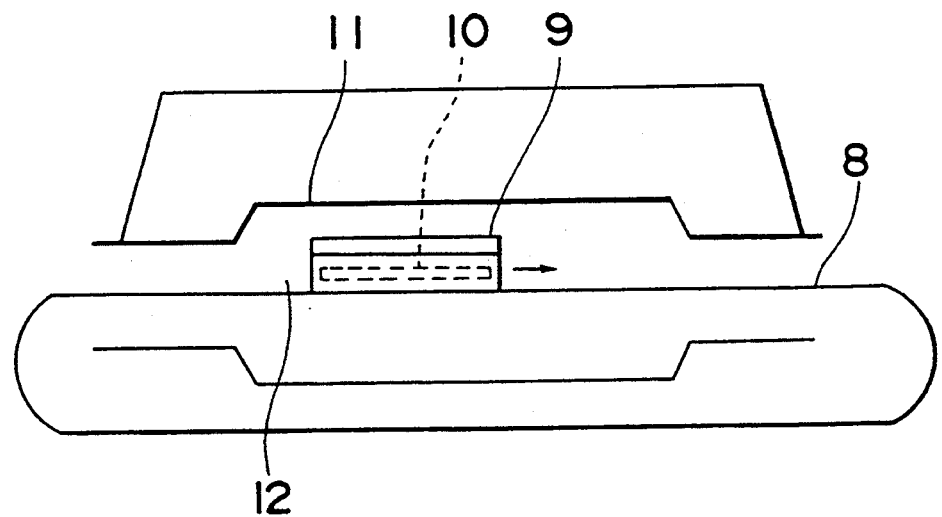
FIG. 4 is a plan sectional view of the conventional plate sintering method.

The thermal flow amount due to the radiation from the z direction is freely controlled by the absence and existence of the hole with the hole diameter of the cover, namely, the open area ratio R (i, j) being retained constant. A focusing operation is effected by simulation until the wanted basic temperature condition is obtained so as to obtain the optimum cover shape (hole distribution). A finer radiation thermal amount can be controlled, the hole pitch can be selected from the processing face by the variation of the grid shape (hole pitch) from coarseness to density. The heat treatment container cover having hole distribution obtained concretely by the above described skill is shown in FIG. 2 by way of example. The portion of darker color is a portion where holes of a constant diameter are distributed.

As is clear from the foregoing description, according to the arrangement of the present invention, a sintering step of extremely high accurate and logical solar cell plate can be made optimum in accordance with the present invention. The maximum temperature difference near the fusing temperature of the film component is conventionally restrained from 125° C. to approximately 80° C. by the application of the present invention. It is confirmed that the dispersion of the light/voltage conversion efficiency of the solar cell is reduced by approximately 10% in effect.

Although the present invention has been fully described by way of example with reference to the accompanying drawings, it is to be noted here that various changes and modifications will be apparent to those skilled in the art. Therefore, unless otherwise such changes and modifications depart from the scope of the preset invention, they should be construed as being included therein.

What is claimed is:

1. A plate sintering method including using a heat transfer analysis of a heat treatment container using a cover having a hole pitch and a hole location for quantitatively determining a cover shape for realizing equal-heat heating, the cover having a single hole or a plurality of holes each uniform in diameter or having a single aperture or a plurality of apertures which have uniform opening in portion areas, and the cover being positioned in a normal direction of the above described plate, parallel to the heat source for generating radiant thermal rays with respect to the heat treatment container with a thin plate shaped plate being accommodated in it; the values being calculated by the following equations:

$$T_{i,j}^{\tau+\Delta\tau} = \frac{\lambda h \Delta t}{C\gamma\delta_1\delta_2}\left\{\frac{\delta_2}{\delta_1}(T_{1+i,j}^\tau - 2T_{i,j}^\tau) + \right.$$

$$\left. \frac{\delta_2}{\delta_1}(T_{i,1+j}^\tau + T_{i,1-j}^\tau - 2T_{i,j}^\tau) + \frac{q}{\lambda h}\right\}T_{i,j}^\tau$$

$$\lambda = \lambda_a + \lambda_b\frac{h_b}{h_a} + \lambda_c\frac{h_c}{h_a} + \lambda_d\frac{h_d}{h_a}$$

$$C\gamma = C_a\gamma_a + \frac{C_b\gamma_b}{C_a\gamma_a}h_b + \frac{C_c\gamma_c}{C_a\gamma_a}h_c + \frac{C_d\gamma_d}{C_a\gamma_a}h_d$$

$$q(\tau) = \alpha\delta_1\delta_2(T_{air} - T_{i,j}) - $$

$$R(i,j)C\sigma \frac{\delta_1\delta_2\left\{\left(\frac{T_{i,j}^p + 273}{100}\right) - \left(\frac{Tw + 273}{100}\right)\right\}}{\frac{1}{\epsilon_1} + \frac{1}{\epsilon_2} - 1}$$

wherein C is a specific heat of a medium $\lambda$ is a heat conduction of the medium, $\gamma$ is a density of the medium $\delta_1$ and $\delta_2$ are respectively different grid internals in the x and y directions, h is the heat treatment container thickness, suffixes a through d respectively refer to a boat, an intermediate plate, the thin plate and the cover, q is the thermal amount of flow in a z direction, $\alpha$ is a heat transfer ratio, Tw is a radiant light source temperature, $C\sigma$ is the Stefan-Boltzmann's constant, $\epsilon_1$ and $\epsilon_2$ are radiant ratios of the heat treatment container and the light source, R(i j) is an open air ratio between the hole diameter area and region areas $\delta_1$ and $\delta_2$ represented by the difference grid.

* * * * *